United States Patent [19]

Kobayashi et al.

[11] Patent Number: 4,723,308
[45] Date of Patent: Feb. 2, 1988

[54] AM SIGNAL TRANSMITTER

[75] Inventors: Naoki Kobayashi; Takashi Asakura; Hideo Sato, all of Tokyo, Japan

[73] Assignee: NEC Corporation, Japan

[21] Appl. No.: 816,195

[22] Filed: Jan. 6, 1986

[30] Foreign Application Priority Data

Jan. 9, 1985 [JP] Japan .................................. 60-1956

[51] Int. Cl.$^4$ .............................................. H04B 1/04
[52] U.S. Cl. .................................... 455/108; 455/127; 375/22
[58] Field of Search ...................... 455/108, 109, 127; 375/22, 41; 332/9 R, 31 R, 37 R

[56] References Cited

U.S. PATENT DOCUMENTS

| | | | |
|---|---|---|---|
| 3,413,570 | 11/1968 | Bruene et al. | 455/108 |
| 4,063,199 | 12/1977 | Oursler, Jr. | 332/9 R |
| 4,122,415 | 10/1978 | Luther, Jr. et al. | 332/37 R |
| 4,186,346 | 1/1980 | Wysocki | 455/108 |
| 4,250,469 | 2/1981 | Cooper et al. | 455/108 |
| 4,272,737 | 6/1981 | Molyneux-Berry | 332/9 R |
| 4,336,615 | 6/1982 | Abt et al. | 455/108 |

FOREIGN PATENT DOCUMENTS 2079105 2/1981 United Kingdom .

Primary Examiner—Jin F. Ng
Attorney, Agent, or Firm—Ostrolenk, Faber, Gerb & Soffen

[57] ABSTRACT

An AM signal transmitter for generating an amplitude modulated carrier comprises a voltage-increasing stage and a power-increasing stage. The voltage-increasing stage includes a pulse width modulator, responsive to an input modulation signal, for producing a pair of high frequency pulse trains which are modulated in width in a complementary fashion. The pair of pulse trains are respectfully fed to a pair of switching and amplifying elements arranged in push-pull fashion. The output of the switching and amplifying elements is processed through a low pass filter to eliminate high frequency components, and is stepped up in voltage by processing through a voltage step-up transformer. The output of the voltage step-up transformer is then fed to the power stage of the AM signal transmitter, which include a power amplifier. Both the power amplifier and the switching and amplifying elements can be powered from a single power source. Other embodiments of the invention can be realized.

10 Claims, 9 Drawing Figures

AM SIGNAL TRANSMITTER

BACKGROUND OF THE INVENTION

The present invention relates to a transmitter for an amplitude modulated signal and, more particularly, to an Amplitude Modulation (AM) signal transmitter provided with a pulse width modulation system.

In a high power AM signal transmitter, it is an important requirement to improve power efficiency as much as possible, and, to this end, class D amplification or pulse width modulation is utilized. In one prior art system, the AM transmitter comprises a modulation amplifier and a modulated power amplifier in the final stage which are connected in series. Modulation amplifier is subject to pulse operation by a pulse width modulated signal. Another prior art AM transmitter is disclosed in UK Patent Application No. 2,079,105, whose modulation amplifier section is structured in a push-pull arrangement. However, in the prior art AM transmitters, a power supply source requires a voltage about twice that needed for operating the power amplifier of the final stage. Therefore, this leads to the disadvantages of a high cost and greater danger owing to the higher voltage.

SUMMARY OF THE INVENTION

An object of the present invention, therefore, is to provide an AM signal transmitter which does not require a power supply source with a voltage higher than the voltage for driving the power amplifier circuit at the final stage.

Another object of the present invention is to provide an AM signal transmitter in which a common power supply source can be used for the modulation amplifier stage and the power amplifier stage, resulting in reduction of manufacturing cost.

According to the invention, there is provided an AM signal transmitter comprising a modulation amplifier for amplifying a pulse width modulated signal, a low pass filter for filtering an output of the modulation amplifier, a transformer for raising at least twice in value a voltage of a filtered output delivered from the low pass filter, and a power amplifier for amplifying an input carrier, wherein a voltage to operate the power amplifier is controlled in response to a voltage-raised signal delivered from the transformer. In the present invention, by using the transformer, the modulation amplifier and the power amplifier can be driven by a common voltage value.

BACKGROUND OF THE INVENTION

Figure 1A:
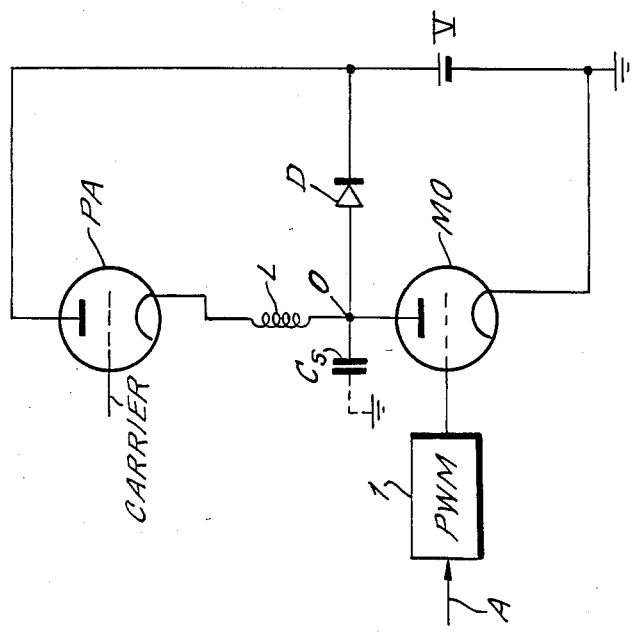
FIGS. 1A and 1B illustrate a circuit configuration of a serial pulse width modulated transmitter according to the prior art.

The prior art will be described with reference to FIGS. 1A and 1B, which illustrate serial pulse width modulated transmitters. In the prior art high power serial pulse width modulation transmitter as illustrated in FIG. 1A, a modulation amplifier MO, is turned on an off by the output of a pulse width modulator 1. A modulated power amplifier PA is turned on and off by a high frequency carrier signal. Modulation amplifier MO and modulated power amplifier PA are connected in series to a power supply source V through an inductance L. Specifically, the anode of the modulation amplifier MO is connected to the positive side of the power supply source V; the cathode thereof is connected to the anode of the modulated amplifier PA through the inductance L; the cathode of the modulated amplifier PA is connected to the negative side (ground) of the power supply source V; and the cathode of the modulation amplifier MO is connected by a diode D to the negative side of the power supply source V. A modulated carrier signal is provided as an output from the anode of the modulated amplifier PA through a capacitor C.

The circuit configuration described above is capable of amplitude modulation with high power and high efficiency by switching on and off the modulation amplifier MO at pulse widths proportional to the amplitudes of a low frequency signal (an audio signal) A and by accumulating energy in the inductance L while the modulation amplifier MO is on. However, this circuit configuration of the prior art has a disadvantage in that modulation distortion occurs and circuits efficiency is lowered, by a stray capacity $C_s$ presented between a filament of the modulation amplifier MO, i.e., the output point O and ground. Most of the stray capacity $C_s$ is attributable to a stray capacity of a filament transformer, and therefore it is difficult to eliminate. To overcome such disadvantage, there is another prior art circuit configuration as shown in FIG. 1B wherein the stray capacity $C_s$ at the output point O of the modulation amplifier MO is decreased by grounding the filament side thereof and the modulated amplifier PA is connected to the positive side of the power supply source V. However, in the FIG. 2 circuit, the cathode of the modulated amplifier PA is floating with respect to ground, and creates undesirable conditions for stable operation, which is required in a high power transmitter.

Both of the prior art circuits described above suffer from the further disadvantage that the voltage of the power supply source V has to be double the voltage normally needed to operate the modulated power amplifier PA. This not only makes the system more expensive but leads to less stability and increased danger due to higher voltage. Additionally the modulation amplifier MO can be destroyed by a transient voltage impressed on it in the event of a failure of the modulated power amplifier PA since the modulation amplifier and the modulated power amplifier are connected together in series through the inductance L. This is a real and substantial possibility because vacuum tubes, which are used for the modulation amplifier MO and the modulated power amplifier PA, are susceptible to frequent operating difficulties. Preventing this would require an elaborate and expensive device.

There is another disadvantage, especially for 100 percent modulation, that whereas the width of the output pulse of the pulse width modulator 1 becomes zero corresponding to the troughs of the low frequency signal, audible distortion may be induced by the stray capacity $C_s$. Furthermore, the modulation amplifier MO has to be active when the modulated power amplifier PA is to be initially regulated.

The power consumed in the modulation amplifier MO corresponds to a carrier component plus a side band component, and therefore the modulation amplifier requires a capacity at least equal to that of the modulated power amplifier PA. Furthermore, when the modulation amplifier MO is cut off, the diode D is made conductive, so that the diode should have sufficient capacity to withstand the voltage and peak current which are applied to the modulation amplifier MO.

Figure 1B:
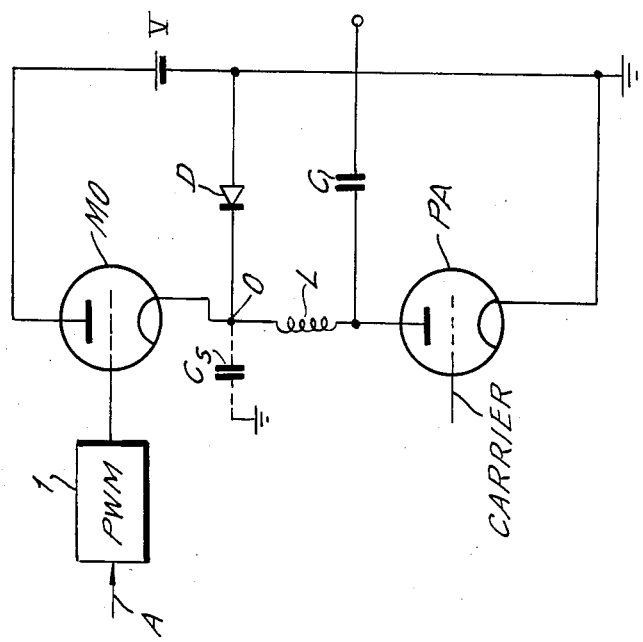

A prior art transmitter disclosed in UK Patent Application No. 2,079,105 is free from many of the disadvantages of the transmitters shown in FIGS. 1A and 1B. However, the transmitter the foregoing U.K. patent application still has the disadvantage that the voltage of the power supply source for the modulation amplifier stage is double that for the modulated power amplifier of the final stage. Therefore, two independant power supply sources are needed and the use of the higher voltage is unaviodable.

PREFERRED EMBODIMENT OF THE INVENTION

Figure 2:
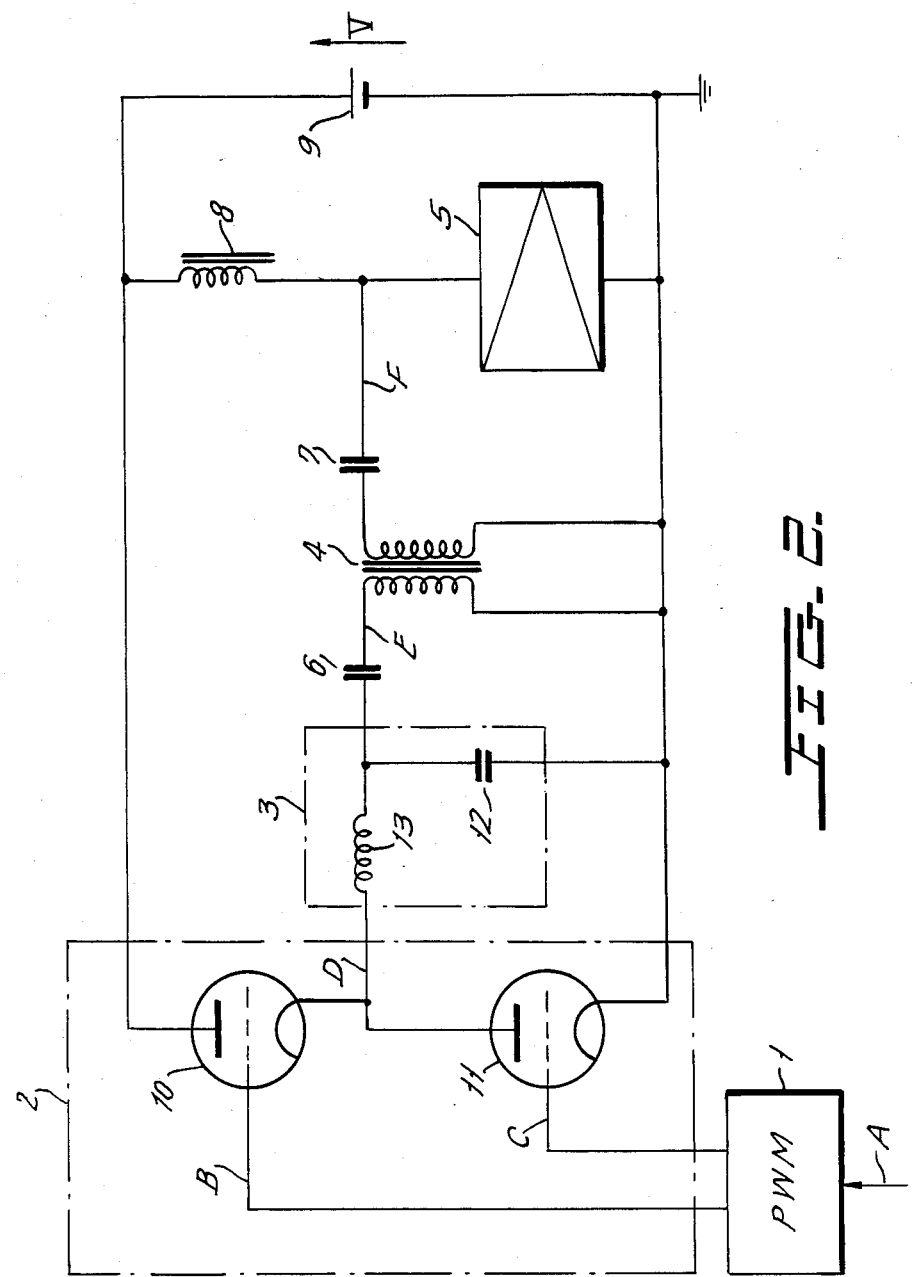
FIG. 2 shows a block diagram of one preferred embodiment according to the present invention.

FIG. 2 is a circuit diagram illustrating one preferred embodiment of the present invention. The embodiment comprises a pulse width modulator 1 for modulating a pulse width in accordance with the amplitude of a low frequency signal (an audio signal) A, a modulation amplifier 2 for amplifying the output of the pulse width modulator 1, a low pass filter 3 for accumulating the output of the modulation amplifier 1, a low frequency transformer 4 for raising the voltage of the output delivered from the low pass filter 3, and a modulated power amplifier 5 whose driving DC voltage is increased or decreased in response to the output of the low frequency transformer 4. FIG. 2 also illustrates coupling capacitors 6 and 7, a modulation choke coil 8, and a common power supply source 9.

Figure 3A:
FIGS. 3A, 3B, 3C, 3D, 3E and 3F show waveforms to illustrate the operation of the preferred embodiment of the invention shown in FIG. 2.
Figure 3B:
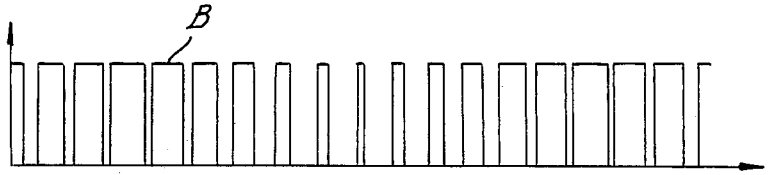
Figure 3C:
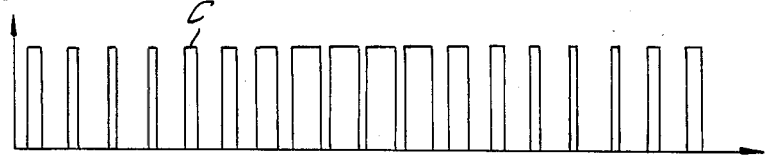

The low frequency signal a, represented by FIG. 3A, is fed to the pulse width modulator 1. Modulated pulse strings B and C, respectively represented by FIGS. 3B and 3C, are produced by the pulse width modulator 1. The pulse string B consists of pulses having a shorter pitch than the pitch of the highest frequency of the low frequency signal A, and its width corresponds to the instantaneous magnitude of the low frequency signal A. Further, the pulse width reaches its minimum (not zero) for the trough of the low frequency signals A and its maximum (slightly narrower than the pulse pitch), i.e., approximately half the pulse pitch for the peak. The pulse string C is reverse to the pulse string B in polarity. In the prior art AM transmitter, when 100 percent modulation is achieved, the pulse width at the trough of the low frequency signal is set to zero and the pulse width at the peak is set to the pulse pitch. On the other hand, according to the present invention, to reduce the undesirable influence of the stray capacity as stated above, the non-zero narrow pulse width at the trough of the low frequency signals A and a pulse width slightly narrower than the pulse pitch at the peak are applied.

Figure 3D:
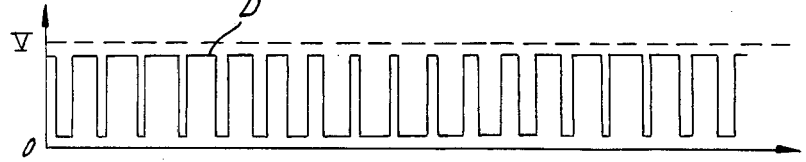
Figure 3E:
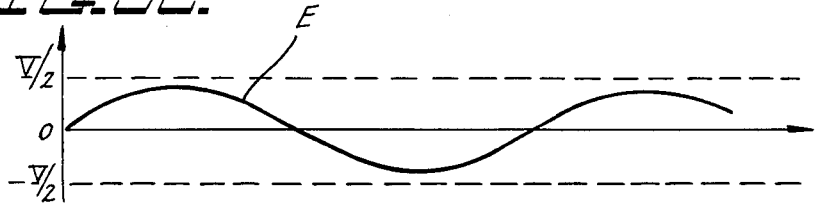

In the modulation amplifier 2, switching elements 10 and 11, together constituting a push-pull arrangement, are comprised of vacuum tubes or semiconductor elements. The switching element 10 is turned on and off in response to the high and low levels of the pulse string B, respectively. The switching element 11 is turned on and off in response to the high and low levels of the pulse string C, respectively. Therefore, the switching elements 10 and 11 are turned on and off in a mutually complementary manner. When the switching element 10 is turned on, the voltage of an output D of the modulation amplifier 2 is slightly lower than the voltage V of the power supply source 9, and when the switching element 11 is turned on, the voltage of the output D is slightly higher than zero. Consequently, the voltage waveform of the output D of the modulation amplifier 2 is such as shown in FIG. 3D. Since the DC component of the output voltage of the low pass filter 3 is removed by the coupling capacitor 6, an input voltage waveform to the low frequency transformer 4 becomes as shown in FIG. 3E, having a peak-to-peak $V(1-\alpha)$ AC voltage. This is an amplified signal of the low frequency signals A. Incidentally, in order to completely eliminate a pulse frequency component, it is desirable to connect a capacitor 12 between the output side of an inductance 13 and the ground. Further, the combination of the inductor 12 and a capacitor 13 in the low pass filter 3 may alternatively connected in multiple repetitive stages.

Figure 3F:
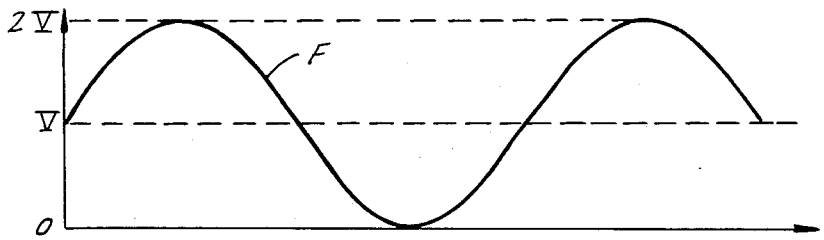

In this embodiment, if the transformation ratio of the low frequency transformer 4 is set to $(1-\alpha):2$, the maximum level of the output waveform at the transformer's secondary winding will be exactly V(or 2 V peak-to-peak). The voltage-raised output waveform is added to the source voltage V supplied through the modulation choke coil 8 and the added voltage is supplied to the modulated power amplifier 5. The added voltage F supplied to the modulated power amplifier 5 varies between 2 V and 0 centering around the source voltage V as shown in FIG. 3F, when the input low frequency signal A has a magnitude selected for maximum modulation. Therefore, in this case, the modulated power amplifier 5 can produce an AM carrier that is 100 percent modulated.

In the present embodiment, since the modulation amplifier 2 does not amplify the carrier, its average power consumption is minimized and it is sufficient to use two elements whose capacity is only a quarter of that of the prior art configurations shown in FIGS. 1A and 1B. Therefore, the transmitter can be readily reduced in size, cost, and undesirable stray capacity. In the low pass filter 3, no DC current flows, but only the low frequency signal does. This feature contributes to the reduction of size and cost of the low pass filter 3. In comparison with the prior art transmitters shown in FIGS. 1A and 1B, the present embodiment needs no diode for supplying large peak current when the modulation amplifier is cut off.

As described above, the present invention enables an AM transmitter to be operated by a common power supply source having a voltage of no more than half of that required in prior art transmitters. The present invention can reduce the size, cost and number of constituent elements in a transmitter. Although the present invention has been described in connection with a plurality of preferred embodiments thereof, many other variations and modifications will now become apparent to those skilled in the art. It is preferred, therefore, that the present invention be limited not by the specific disclosure herein, but only by the appended claims.

What is claimed is:

1. An amplitude modulated signal transmitter, comprising:
   pulse width modulating means for modulating a pulse width of a high frequency pulse train in response to an input modulating signal to produce a pulse width modulated signal;
   modulation amplifying means for amplifying said pulse width modulated signal and producing an amplified pulse width modulated signal, said modulation amplifying means including a pair of switching elements which are connected in series and arranged in push-pull fashion;

filtering means for filtering the amplified pulse width modulated signal and producing a filtered signal;

transformer means coupled to said filtering means for producing an output signal of increased voltage relative to said filtered signal; and power amplifier means for generating an amplitude-modulated carrier in response to said voltage-increased signal.

2. An amplitude modulated signal transmitter as claimed in claim 1, wherein a single, common power supply source is included and supplies power to both said modulation amplifying means and said power amplifier means.

3. An amplitude modulated signal transmitter as claimed in claim 1, wherein said transformer means has at least a two-to-one step-up transforming ratio.

4. An amplitude modulated signal transmitter as claimed in claim 1, wherein said filtering means comprises means for filtering from said amplified pulse width modulated signal all except low frequencies.

5. An amplitude modulated signal transmitter for generating an amplitude-modulated carrier, comprising:
a power supply source;
modulation amplifying means driven by said power supply source for amplifying a pulse width modulated signal to produce an amplified pulse width modulated signal;
filtering means for low-pass filtering said amplified pulse width modulated signal to produce a filtered signal;
transformer means coupled to said filtering means for producing an output signal of increased voltage relative to said filtered signal;
an inductance coil; and
power amplifying means for generating the amplitude-modulated carrier and having an input electrode, said input electrode being connected to said power supply source through said inductance coil, and said increased voltage output signal of said transformer means being supplied to a circuit node between said input electrode of said power amplifying means and said inductance coil.

6. An amplitude modulated signal transmitter for generating an amplitude-modulated carrier as claimed in claim 5, wherein said modulation amplifying means includes a pair of switching elements which are connected in series and arranged in push-pull fashion.

7. An amplitude modulated signal transmitter for generating an amplitude-modulated carrier as claimed in claim 5, wherein said transformer means has at least a two-to-one step-up transforming ratio.

8. An amplitude modulated signal transmitter, comprising:
pulse width modulating means for modulating pulse width of a high frequency pulse train in response to an input modulating signal to produce a pulse width modulated signal, said pulse width modulating means comprising means for producing a pair of high frequency pulse trains with widths modulated in a complementary manner;
modulation amplifying means for amplifying said pulse width modulated signal and producing an amplified pulse width modulated signal, said modulation amplifying means comprising a pair of switching elements which are connected in series and arranged in push-pull fashion, said pair of switching elements being respectively responsive to said pair of modulated high frequency pulse trains from said pulse width modulating means;
filtering and voltage-increasing means responsive to said amplified pulse width modulated signal for producing a processed signal of increased voltage and without frequency components above a predetermined level with respect to said amplified pulse width modulated signal; and
power amplifier means for generating an amplitude-modulated carrier in response to said processed signal.

9. An amplitude modulated signal transmitter as claimed in claim 8, further including power supply electrodes coupled to said modulation amplifying means and to said power amplifier means for supplying power to both said means and being adapted for connection to a single power source.

10. An amplitude modulated signal transmitter as claimed in claim 8, wherein said filtering and voltage-increasing means comprises a low pass filter for processing the output of said modulation amplifying means and a voltage step-up transformer for processing the output of said low pass filter and producing said processed signal, which is then fed to said power amplifier means.

* * * * *